(12) United States Patent
Bairo (10) Patent No.: US 8,805,637 B2
(45) Date of Patent: Aug. 12, 2014

(54) TEST ELEMENT GROUP AND SEMICONDUCTOR DEVICE

(75) Inventor: Masaaki Bairo, Kanagawa (JP)

(73) Assignee: Sony Corporation, Tokyo (JP)

( * ) Notice: Subject to any disclaimer, the term of this patent is extended or adjusted under 35 U.S.C. 154(b) by 640 days.

(21) Appl. No.: 13/071,689

(22) Filed: Mar. 25, 2011

(65) Prior Publication Data

US 2011/0246121 A1 Oct. 6, 2011

(30) Foreign Application Priority Data

Apr. 2, 2010 (JP) ................. 2010-086312

(51) Int. Cl.
*G01R 31/14* (2006.01)
(52) U.S. Cl.
USPC .......................................... 702/120; 702/122
(58) Field of Classification Search
USPC .......... 710/2, 3, 8, 20, 36, 100; 702/120, 122; 370/431
See application file for complete search history.

(56) References Cited

U.S. PATENT DOCUMENTS 4,965,550 A * 10/1990 Wroblewski .................. 340/524
2008/0294817 A1* 11/2008 Tsuneki ........................ 710/100

FOREIGN PATENT DOCUMENTS

JP 11-084420 3/1999
JP 2007-103946 4/2007

* cited by examiner

*Primary Examiner* — Elias Desta
(74) *Attorney, Agent, or Firm* — Dentons US LLP (57) ABSTRACT

A device with a plurality of elements separated into groups, each element including an activation terminal, an input terminal and an output terminal, a plurality of first signal lines, and a plurality of second signal lines, where the input terminals of each element in each group are commonly connected to one of the plurality of first signal lines, the input terminals of the different groups are connected to different first signal lines, and the output terminals of the each element in each group are independently connected to a different one of the plurality of second signal lines.

20 Claims, 10 Drawing Sheets

| NUMBER OF SIGNAL LINES | LAYOUT OF COMPARATIVE EXAMPLE | | | | LAYOUT OF PRESENT EMBODIMENT | | | | RESULT OF COMPARISON | |
|---|---|---|---|---|---|---|---|---|---|---|
| | MAXIMUM DUT NUMBER | SELECTION CIRCUIT PAD NUMBER | TOTAL PAD NUMBER | MAXIMUM DUT NUMBER/TOTAL PAD NUMBER | MAXIMUM DUT NUMBER | SELECTION CIRCUIT PAD NUMBER | TOTAL PAD NUMBER | MAXIMUM DUT NUMBER/TOTAL PAD NUMBER | DUT NUMBER DIFFERENCE | PAD NUMBER DIFFERENCE |
| 2 | 1 | 3 | 5 | 0.2 | 1 | 3 | 5 | 0.2 | 0 | 0 |
| 3 | 2 | 3 | 6 | 0.3 | 3 | 3 | 6 | 0.5 | 1 | 0 |
| 4 | 4 | 3 | 7 | 0.6 | 6 | 4 | 8 | 0.8 | 2 | 1 |
| 5 | 6 | 4 | 9 | 0.7 | 10 | 4 | 9 | 1.1 | 4 | 0 |
| 6 | 9 | 4 | 10 | 0.9 | 15 | 5 | 11 | 1.4 | 6 | 1 |
| 7 | 12 | 4 | 11 | 1.1 | 21 | 5 | 12 | 1.8 | 9 | 1 |
| 8 | 16 | 4 | 12 | 1.3 | 28 | 5 | 13 | 2.2 | 12 | 1 |
| 9 | 20 | 5 | 14 | 1.4 | 36 | 5 | 14 | 2.6 | 16 | 0 |
| 10 | 25 | 5 | 15 | 1.7 | 45 | 6 | 16 | 2.8 | 20 | 1 |
| ... | | | | | | | | | | |
| 20 | 100 | 6 | 26 | 3.8 | 190 | 7 | 27 | 7.0 | 90 | 1 |
| ... | | | | | | | | | | |
| 30 | 225 | 6 | 36 | 6.3 | 435 | 7 | 37 | 11.8 | 210 | 1 |
| ... | | | | | | | | | | |
| 35 | 306 | 7 | 42 | 7.3 | 595 | 8 | 43 | 13.8 | 289 | 1 |
| ... | | | | | | | | | | |
| 40 | 400 | 7 | 47 | 8.5 | 780 | 8 | 48 | 16.3 | 380 | 1 |
| ... | | | | | | | | | | |
| 50 | 625 | 7 | 57 | 11.0 | 1225 | 8 | 58 | 21.1 | 600 | 1 |

TEST ELEMENT GROUP AND SEMICONDUCTOR DEVICE

CROSS-REFERENCE TO RELATED APPLICATIONS

This application claims priority to Japanese Priority Patent Application JP 2010-086312 filed in the Japanese Patent Office on Apr. 2, 2010, which is fully incorporated herein by reference to the extent permitted by law.

BACKGROUND OF THE INVENTION

This invention relates to a test element group (TEG) including a large number of elements connected to each other and a semiconductor device which includes a test element group provided on a semiconductor substrate.

In recent years, together with refinement of elements, the layout dependency of element characteristics has become notable. In addition, a dispersion in element characteristic within a wafer has increased. Such layout dependency and dispersion have become a subject upon circuit fabrication. For example, the layout dependency of a threshold voltage, a current-voltage characteristic and so forth and the wafer in-plane dispersion of MOSFETs have a significant influence on the reliability of semiconductor devices and the yield upon fabrication.

As a method of improving the reliability of semiconductor devices and the yield upon fabrication of semiconductor devices, circuit designing is generally used wherein the layout dependency of an element characteristic and the dispersion in element characteristic on a fabrication line are grasped and permitted. Further, to monitor the layout dependency in element characteristic and the characteristic dispersion on a fabrication line of semiconductor devices and manage the numerical values of them leads to stabilization of the yield of semiconductor devices.

In the past, as a method of measuring the layout dependency of an element characteristic and the dispersion of an element characteristic, a method of evaluating a characteristic of a unit element included in each of a plurality of TEGs provided on a wafer is known. Since the TEG includes an element similar to an actual operation element used in a semiconductor element, by evaluating the TEG, the layout dependency of a characteristic and the characteristic dispersion of actual operation elements in the semiconductor device can be estimated. However, every time the generation advances, the layout is complicated and the amount of data of element characteristics necessary for circuit design increases, and also the number of elements whose evaluation is required increases.

Figure 12:
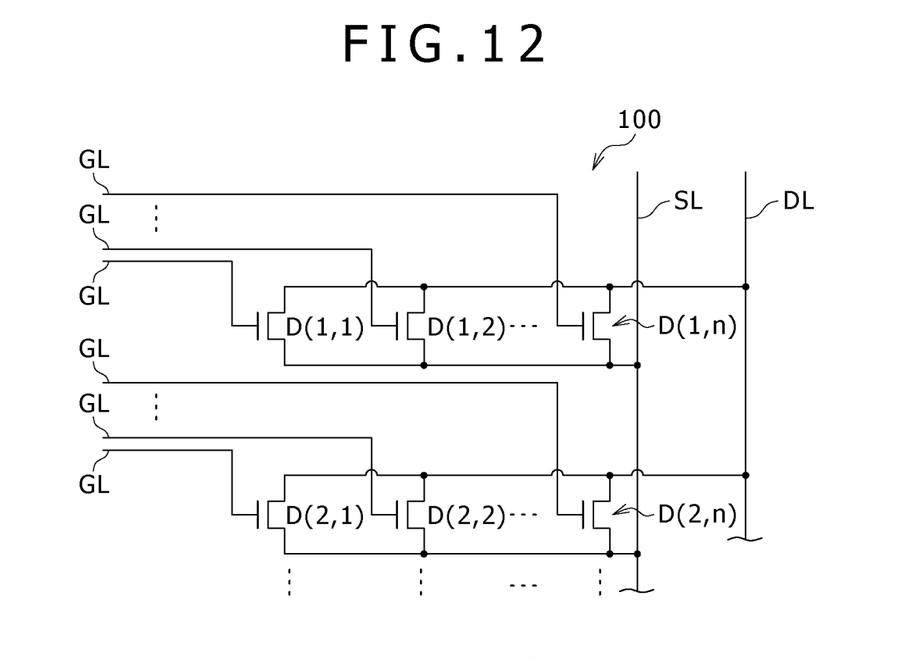
FIG. 12 is a circuit diagram of an existing semiconductor device

Therefore, in an existing evaluation method where a plurality of TEGs in each of which one or several elements which can be evaluated are incorporated, the area for incorporating a required number of TEGs in a semiconductor chip becomes very great. Therefore, in recent years, a method has been proposed wherein, as seen in FIG. 12, a large number of elements such as D(1, 1), D(1, 2), ..., D(1, n), D(2, 1), D(2, 2), ..., D(2, n), ... are disposed in a matrix to achieve a high installation density of elements and a characteristic of the large number of elements is acquired over a small TEG area. The method is disclosed, in Japanese Patent Laid-Open No. 2007-103946 (hereinafter referred to as Patent Document 1).

SUMMARY OF THE INVENTION

The present disclosure provides one or more inventions to address the foregoing problems and to facilitate element testing with minimized signal line usage.

One embodiment that is consistent with the present invention includes, a device comprising a plurality of elements separated into groups, each element including an activation terminal, an input terminal and an output terminal, a plurality of first signal lines, and a plurality of second signal lines, where the input terminals of each element in each group are commonly connected to one of the plurality of first signal lines, the input terminals of the different groups are connected to different first signal lines, and the output terminals of the each element in each group are independently connected to a different one of the plurality of second signal lines.

In another embodiment consistent with the present invention, the output terminals of elements in different groups share a common second signal line.

In another embodiment consistent with the present invention, the output terminal of at least one element in one group is independently connected to a first signal line of another group.

In another embodiment consistent with the present invention, the device includes a selection circuit that includes a plurality of selection elements, each selection element electrically coupled to the activation terminal of a corresponding element.

In another embodiment consistent with the present invention, each selection element sends a selection signal to the activation terminal of the corresponding element when the element is selected by the selection circuit.

In another embodiment consistent with the present invention, the device includes a selection circuit that selects one element from each group, each selected element not sharing a common second signal line, where each selected element receives a current signal from the first signal line and outputs the current signal to the second signal line connected to the selected element.

In another embodiment consistent with the present invention, the current sent through the first signal line is not output from the output terminals of the non selected elements sharing the same first signal line.

In another embodiment consistent with the present invention, the selection circuit simultaneously selects one element from each group with the selected elements not sharing a common second signal line.

In another embodiment consistent with the present invention, each element is a pixel cell.

One embodiment consistent with the present invention includes a method of testing a plurality of elements of device arranged into groups with each element including an activation terminal, an input terminal and an output terminal, the device also including a plurality of first signal lines and a plurality of second signal lines, the input terminals of each element in each group being commonly connected to one of the plurality of first signal lines, the input terminals of the different groups being connected to different first signal lines, and the output terminals of the each element in each group being independently connected to a different one of the plurality of second signal lines, the method comprising the steps of activating one of the plurality of elements by sending a first signal to the activation terminal of the element, sending a second signal to the input terminal of the activated element by the first signal line, and measuring a characteristic of the activated element by evaluating a third signal on the second signal line connected to the activated element.

In another embodiment consistent with the present invention, the third signal is sent on a second signal line connected to at least one element in another group.

In another embodiment consistent with the present invention, the third signal is sent on a first signal line connected to at least one element in another group.

In another embodiment consistent with the present invention, a selection circuit sends the first signal to each selected element.

In another embodiment consistent with the present invention, the selection circuit includes a plurality of selection elements, each selection element being electrically connected to the activation terminal of a corresponding element.

In another embodiment consistent with the present invention, each selected element does not share a common second signal line, and the second signal is a current signal sent to the input terminal of each selected element by the first signal line and is output from the output terminal of the selected element to the second signal line connected to the selected element.

In another embodiment consistent with the present invention, the second signal sent on the first signal line is not output from the output terminals of the non selected elements sharing the same first signal line.

In another embodiment consistent with the present invention the method includes the step of simultaneously activating one element in each group by sending the first signal to each selected element in each group, where the selected elements do not share a common second signal line.

In another embodiment consistent with the present invention, each element is a pixel cell.

One embodiment that is consistent with the present invention includes a device comprising a plurality of elements, each element including an activation terminal, an input terminal and an output terminal, a plurality of first signal lines, and a plurality of second signal lines, where the input terminals of each element are commonly connected to one of the plurality of first signal lines, and the output terminals of the each element are independently connected to a different one of the plurality of second signal lines.

One embodiment consistent with the present invention includes a method of testing a plurality of elements of a device, each element including an activation terminal, an input terminal and an output terminal, the device also including a first signal line and a plurality of second signal lines, the input terminal of each element being commonly connected to the first signal line, and the output terminal of each element being independently connected to a different second signal line, the method comprising activating one of the plurality of elements by sending a first signal to the activation terminal of the element, sending a second signal to the input terminal of the activated element by the first signal line connected thereto, and measuring a characteristic of the activated element by evaluating a third signal on the second signal line connected to the activated element.

Other systems, methods, features, and advantages of the present invention(s) will be or will become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE DRAWINGS

The accompanying drawings, which are incorporated in and constitute a part of this specification, illustrate an implementation of the present invention and, together with the description, serve to explain the advantages and principles of the invention. In the drawings

DETAILED DESCRIPTION OF THE PREFERRED EMBODIMENTS

In the following, preferred embodiments of the present invention are described in detail with reference to the accompanying drawings.

In the method disclosed previously discussed all elements $D(1, 1)$, $D(1, 2)$, ..., $D(1, n)$ included in one row are connected commonly at the drain thereof to a drain line DL. Therefore, when one element such as the element $D(1, 1)$ is to be measured, in case where composite current of current flowing through the element $D(1, 1)$ and off-leak current (current flowing between the drain and the source because the transistor is not placed into a fully off state) of all of the other elements $D(1, 2)$, ..., $D(1, n)$ is detected from the drain line DL. Accordingly, there is a problem that, if the off-leak current is so high that it cannot be ignored from a relationship thereof with current flowing through the element $D(1, 1)$ of the measurement target, then an element characteristic of the element $D(1, 1)$ of the measurement target cannot be measured accurately.

Therefore, it seems a possible idea to apply an X-Y addressing method disclosed, for example, in Japanese Patent Laid-Open No. Hei 11-84420 (hereinafter referred to as Patent Document 2) as a method to be used in place of the method of Patent Document 1. In particular, in the method mentioned, the drains of all elements included in one row such as the elements $D(1, 1)$, $D(1, 2)$, ..., $D(1, n)$ are connected to individually different drain lines DL, and besides the drains of all of the elements included in one column such as the elements $D(1, 1)$, $D(2, 1)$, ... are connected to a common drain line DL. According to the method, when one element such as the element $D(1, 1)$ is to be measured, current flowing through the element $D(1, 1)$ and off-leak current of all of the other elements $D(1, 2)$, ..., $D(1, n)$, $D(2, 1)$, $D(2, 2)$, ..., $D(2, n)$, ... are not combined with each other. Therefore, an element characteristic of the element $D(1, 1)$ of the measurement target can be measured accurately.

However, if this method is applied, then the total number of the drain lines DL and source lines SL becomes very great, and consequently, the number of pad electrodes connected to the drain lines DL and source lines SL becomes very great. Accordingly, there is a problem that, as the number of elements to be incorporated in a TEG increases, the area of the TEG becomes very great.

Therefore, it is desirable to provide a test element group and a semiconductor device including the test element group wherein a comparatively great number of elements can be incorporated in a small area and an element characteristic can be measured with a high degree of accuracy.

First Embodiment

Configuration

Figure 1:
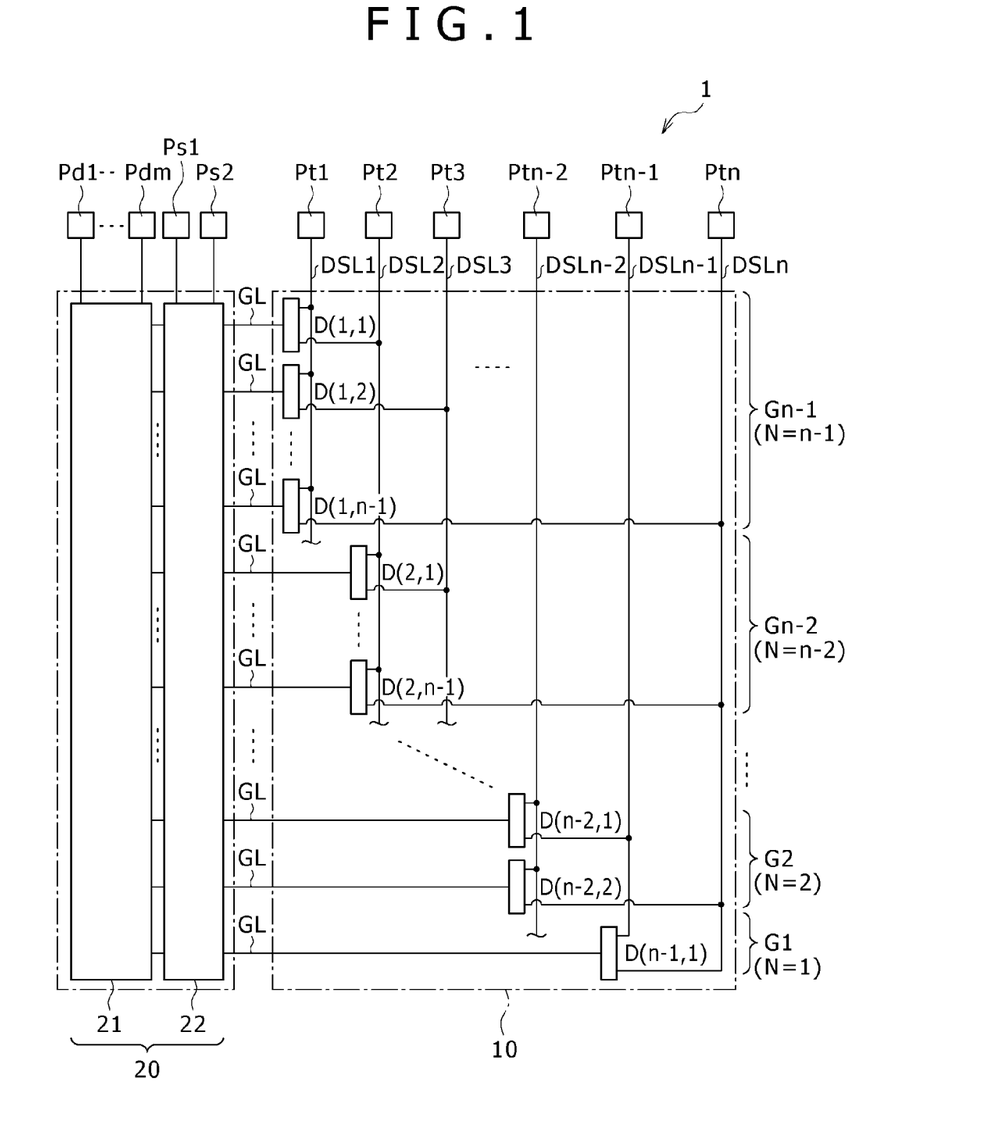
FIG. 1 is a circuit diagram of a semiconductor device that is consistent with the present invention.

FIG. 1 shows an example of a general configuration of a semiconductor device 1 according to a first embodiment of the present invention. Referring to FIG. 1, the semiconductor device 1 includes a test element group 10 and a selection circuit 20 provided on a semiconductor substrate not shown.

(Test Element Group)

The test element group 10 includes a plurality of elements for the mounting evaluation disposed two-dimensionally and connected to each other. For example, as shown in FIG. 1, the test element group 10 includes $\Sigma[k=1, n-1]k$ elements $D(1, 1), D(1, 2), \ldots, D(1, n-1), D(2, 1), \ldots, D(2, n-2), \ldots, D(n-2, 1), D(n-2, 2), D(n-1, 1)$. n is a positive number equal to or greater than 3. Meanwhile, $\Sigma[k=1, n-1]k$ signifies $1+2+3+\ldots+n-1$. In the following description, the term element D not shown is used as a general term of each of the elements included in the test element group 10. It is to be noted that the element D corresponds to a particular example of the "evaluating cell" in the present invention.

The $\Sigma[k=1, n-1]k$ elements D included in the test element group 10 are classified into n−1 groups G1, G2, . . . , Gn−2, Gn−1. In the following description, as a general term of a group, group GN (N is a positive number equal to or greater than 1 but equal to or smaller than n−1). The group GN includes N elements D. For example, the group G1 includes one element D, and the group G2 includes two elements D. Further, for example, the group Gn−2 includes n−2 elements D, and the group Gn−1 includes n−1 elements D. In short, the number N of the elements D included in each group GN is different among different groups GN and remains within a range from 1 to n−1.

Figure 2:
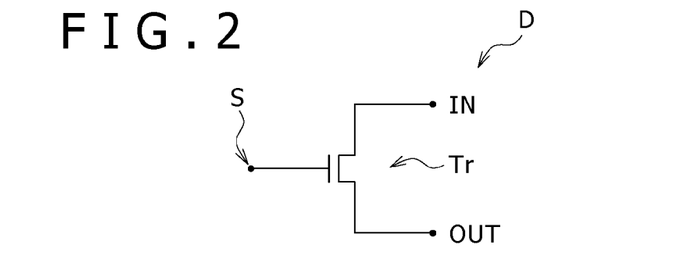
FIG. 2 is a circuit diagram of a evaluating cell that is consistent with the present invention.

The element D is an element having three terminals as shown in FIG. 1 and is configured including a single transistor Tr as shown in FIG. 2. The transistor Tr is, for example, a field effect transistor, a static induction transistor or a bipolar transistor. The element D has one selection terminal S, one input terminal IN and one output terminal OUT. The selection terminal S is connected to the gate of the transistor Tr, and the input terminal IN is connected to the drain or the source of the transistor Tr while the output terminal OUT is connected to that one of the drain and the source of the transistor Tr which is not connected to the input terminal IN.

The test element group 10 further includes a plurality of drain source lines DSL not shown and a plurality of gate lines GL. In the following description, as a general term of each drain source line, the drain source line DSL mentioned above is used. It is to be noted that the gate line GL corresponds to a particular example of the "selection line" in the present invention, and the drain source line DSL corresponds to a particular example of the "first signal line," "second signal line," "third signal line" or "fourth signal line" in the present invention.

The test element group 10 includes as shown in FIG. 1, n drain source lines DSL1, DSL2, DSL3, . . . , DSLn−2, DSLn−1, DSLn and $\Sigma[k=1, n-1]k$ gate lines GL. Each gate line GL is electrically connected to the selection terminal S of one element D. Each drain source line DSL is electrically connected to the input terminal IN or the output terminal OUT of the element D.

The number of drain source lines DSL allocated to each group GN is N+1. For example, to the group G1, two drain source lines DSL are allocated, and to the group G2, three drain source lines DSL are allocated. Further, to the group Gn−2, n−1 drain source lines DSL are allocated, and to the group Gn−1, n drain source lines DSL are allocated. In short, the number of drain source lines DSL allocated to a group is different among different ones of the groups GN and remains within a range from 2 to n.

All of the input terminals IN included in each group GN are electrically connected commonly to those ones of the n drain source lines DSL which are not connected to the input terminals IN included in any other group GN. In one embodiment that is consistent with the present invention, the one input terminal IN included in the group G1 is electrically connected to the drain source line DSLn which is not connected to the input terminals IN included in any other group GN, that is, in any of the groups G2 to Gn−1. Further, the two input terminals IN included in the group G2 are electrically connected commonly to the one drain source line DSLn−2 which is not connected to the input terminals IN included in any other group GN, that is, in any of the groups G1 and G3 to Gn−1. Further, the n−2 input terminals IN included in the group Gn−2 are electrically connected commonly to the one drain source line DSL2 which is not connected to the input terminals IN of any other group GN, that is, in any of the groups G1 to Gn−3 and Gn−1. Further, the n−1 input terminals IN included in the group Gn−1 are commonly electrically connected to the one drain source line DSL1 which is not connected to the input terminals IN included in any other group GN, that is, in any of the groups G1 to Gn−2.

All output terminals OUT included in each group GN are electrically connected independently of each other or one by one to those of the n drain source lines DSL which are not connected to the input terminals IN included in the group GN itself. In one embodiment that is consistent with the present invention, the one output terminal OUT included in the group G1 is electrically connected to the drain source line DSLn which is not connected to the input terminal IN included in the group G1 itself. Further, the two output terminals OUT included in the group G2 are electrically connected independently of each other or one by one to the two drain source lines DSLn−1 and DSLn which are not connected to the two input terminals IN included in the group G2 itself. Further, the n−2 output terminals OUT included in the group Gn−2 are electrically connected independently of each other or one by one to the n−2 drain source lines DSL3 to DSLn which are not connected to the n−2 input terminals IN included in the group Gn−2 itself. Further, the n−1 output terminals OUT included in the group Gn−1 are electrically connected independently of each other or one by one to the n−1 drain source lines DSL2 to DSLn which are not connected to the n−1 input terminals IN included in the group Gn−1 itself.

In the group GX1 or first group including a plurality of elements D, which are first evaluating cells, selected arbitrarily from among a plurality of elements D, the input terminals IN of all elements D are electrically connected commonly to one drain source line DSL, which is a second signal line, from among a plurality of drain source lines DSL or first signal lines. Further, in the group GX1, the output terminals OUT of all elements D are electrically connected independently of the other elements D, which are first evaluating cells, to one drain source line DSL from among the plural drain source lines DSL or third signal lines of the plural drain source lines DSL or first signal lines other than the drain source line DSL or second signal line.

Meanwhile, in the group GX2 or second group including one or a plurality of elements D or second evaluating cells different from the elements D included in the group GX1 from among the plural elements D, the input terminals IN of all elements D are commonly electrically connected to one drain source line DSL, that is, a fourth signal line, from among the plural drain source lines DSL or third signal lines. Furthermore, in the group GX2, the output terminals OUT of all elements D are electrically connected independently of any other element D or second evaluating cell to one drain source line DSL other than the drain source line DSL or fourth signal line from among the plural drain source lines DSL or third signal lines.

Figure 3:
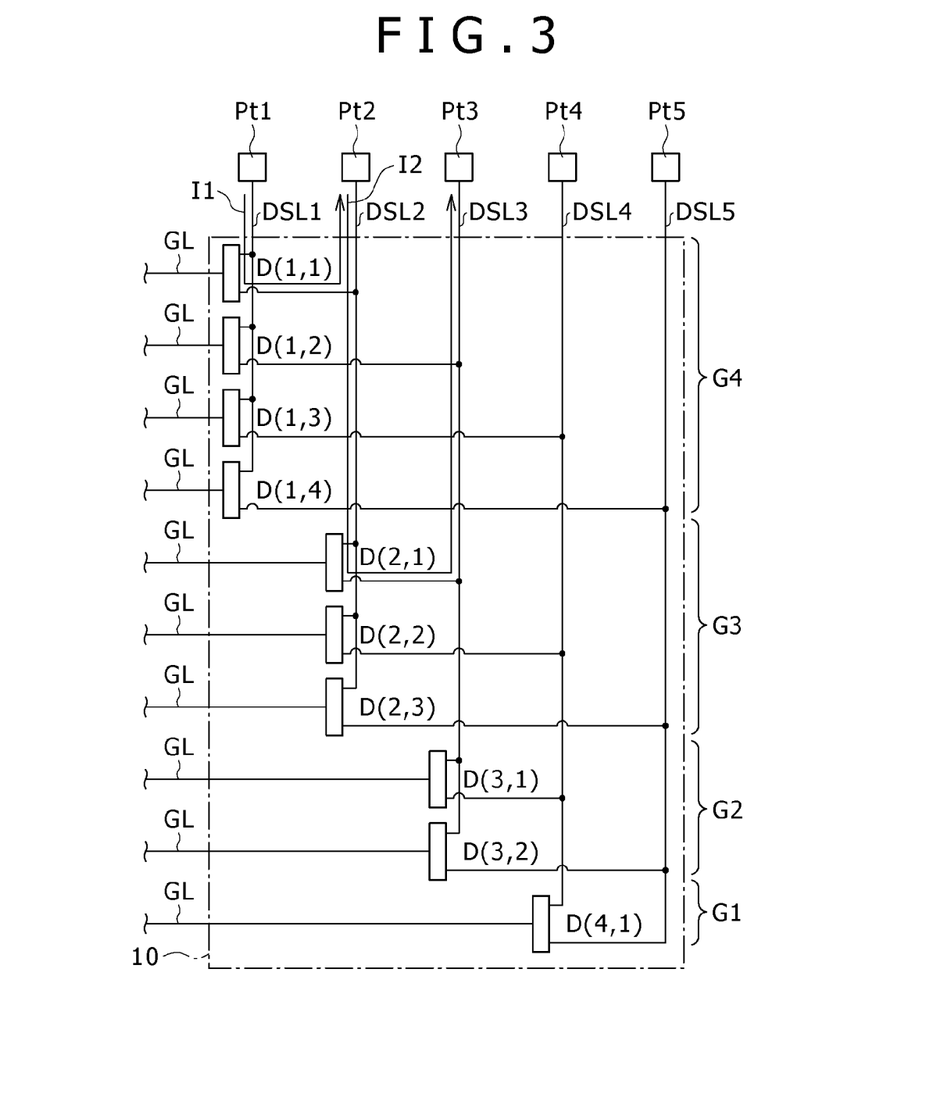
FIG. 3 is a circuit diagram of a test element that is consistent with the present invention.

FIG. 3 shows an example of a layout of the test element group 10 where $\Sigma[k=1, 4]k$ elements D, five drain source lines DSL and $\Sigma[k=1, 4]k$ gate lines GL are provided in the test element group 10. In this instance, four groups GN are provided in the test element group 10, and four elements D are classified in the group G4; three elements D in the group G3; two elements D in the group G2; and one element D is classified in the group G1. Further, a common line of the four input terminals IN of the group G4 is the drain source line DSL1, and a common line of the three input terminals IN of the group G3 is the drain source line DSL2. Further, a common line of the two input terminals IN of the group G3 is the drain source line DSL3, and the one input terminal IN of the group G4 is connected to the drain source line DSL4. Further, the four output terminals OUT of the group G4 are connected independently of each other or one by one to the drain source lines DSL2 to DSL5, and the three output terminals OUT of the group G3 are connected independently of each other or one by one to the drain source lines DSL3 to DSL5. Further, the two output terminals OUT of the group G2 are connected independently of each other or one by one to the drain source lines DSL4 and DSL5, and the one output terminal OUT of the group G1 is connected to the drain source line DSL5.

(Selection Circuit)

The selection circuit 20 selects one of the elements D in the test element group 10. The selection circuit 20 includes a decoder circuit 21 and a switch circuit 22, as seen in FIG. 1.

Figure 4:
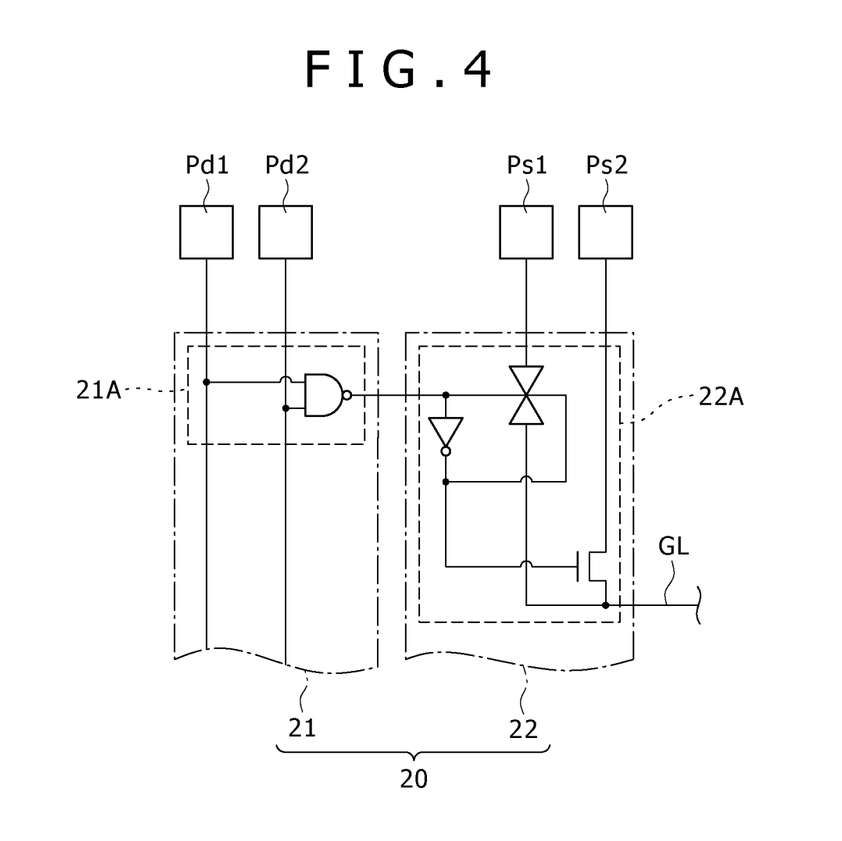
FIG. 4 is a circuit diagram of a selection circuit that is consistent with the present invention.

The switch circuit 22 includes a switch element 22A for each of the elements D, as seen in FIG. 4. The switch element 22A outputs one of a selection gate voltage or on voltage inputted to a pad Ps1 and a non-selection gate voltage or off voltage inputted to a pad Ps2 to a selection terminal S of the element D. If the selection signal is inputted, then the switch element 22A outputs the selection gate voltage to the selection terminal S of the element D, but if the non-selection is inputted from the decoder circuit 21, then the switch element 22A outputs the non-selection gate signal to the selection terminal S of the element D.

The decoder circuit 21 includes a decoder element 21A for each of the switch elements 22A, as shown in FIG. 4. The decoder element 21A outputs a selection signal or a non-selection signal as a control signal based on a gate selection signal inputted to a pad Pd1 or Pd2. It is to be noted that, while two pads Pd1 and Pd2 are shown in FIG. 4, the use of the two pads Pd1 and Pd2 is limited to a case in which all of the switch elements 22A can be selected using 2 bits, that is, in which four switch elements 22A are provided. Accordingly, if all switch elements 22A cannot be selected using 2 bits, then a number of pads with which all of the switch elements 22A can be selected are required.

[Operation]

Now, an example of operation of the semiconductor device 1 of the present embodiment is described with reference to FIG. 3.

First, a gate selection signal is inputted to the decoder circuit 21 from an evaluation apparatus not shown to be used for evaluation of the semiconductor device 1. Consequently, from the switch element 22A which corresponds to the element D(1, 1), a selection gate voltage or on voltage is outputted to the selection terminal S of the element D(1, 1). At this time, signals for evaluation are inputted from the evaluation apparatus not shown to pads Pt1 to Pt5. More particularly, a positive bias voltage is applied to the pad Pt1 to which the input terminal IN of the element D(1, 1) to which the selection gate voltage is inputted is connected. Further, to the pad Pt2 to which the output terminal OUT of the element D(1, 1) to which the selection gate voltage is applied is connected, a bias voltage lower than the voltage to the pad Pt1 is applied. In one embodiment that is consistent with the present invention, 0 volt is applied to the pad Pt2. Further, to the pads Pt3 to Pt5 which are not connected to the input terminal IN and the output terminal OUT of the element D(1, 1), 0 volt is applied. It is to be noted that the pads Pt3 to Pt5 may be in an electrically floating state.

Consequently, the element D(1, 1) to which the selection gate voltage is inputted is rendered active, and the transistor Tr turns on, and current I1 flows from the pad Pt1 to the pad Pt2 thorough the element D(1, 1). At this time, current which flows through the other elements D(1, 2), D(1, 3), . . . , D(1, n−1), D(2, 1), . . . , D(2, n−2), . . . , D(n−2, 1), D(n−2, 2) and D(n−1, 1) which are not active is not added to the current I1 detected at the pad Pt2. Accordingly, the evaluation apparatus can measure an element characteristic of the element D(1, 1) of the measurement target accurately based on the current I1 detected at the pad Pt2.

Similarly, if the element D(2, 1) is selected and a positive bias voltage is applied to the pad Pt2 to which the input terminal IN of the element D(2, 1) is connected while a bias voltage lower than the voltage at the pad Pt2 is applied to the pad Pt3 to which the output terminal OUT of the decoder circuit 21 is connected, then the element D(2, 1) is rendered active and current I2 flows from the pad Pt2 to the pad Pt3 through the element D(2, 1). At this time, current which flows through the other elements D(1, 1), D(1, 2), D(1, 3), . . . , D(1, n−1), . . . , D(2, n−2), . . . , D(n−2, 1), D(n−2, 2) and D(n−1, 1) which are not active is not added to the current I2 detected at the pad Pt3. Accordingly, the evaluation apparatus can measure an element characteristic of the element D(2, 1) of the measurement target accurately based on the current I2 detected at the pad Pt3.

In the semiconductor device 1 of the present embodiment, in each group GN, all input terminals IN are connected to a common drain source line DSL. Consequently, the number of drain source lines DSL of the test element group 10 can be suppressed to n which is much small than the number of the elements D, that is, $\Sigma[k=1, n−1]k$. As a result, also the number of pads Pt1 to Ptn connected to the drain source lines DSL can be suppressed to n, and therefore, the area of the semiconductor device 1 can be reduced much from that according to the X-Y address method.

Further, in the present embodiment, in each group GN, all output terminals OUT are connected independently of any other output terminal OUT to those drain source lines DSL which are not connected to the input terminals IN. Further, a drain source line DSL common to one group GN and another drain source line DSL which is common to any other group GN are different from each other. Consequently, while the drain source lines DSL are used commonly, the possibility that current flowing through an element D of the measurement target and off leak current flowing to the other elements D which are not the target object may be combined with each other can be eliminated.

Consistent with the present embodiment, it is possible to incorporate a greater number of elements D in a smaller area and measure an element characteristic with a high degree of accuracy.

Working Example

Now, superiority of the semiconductor device 1 of the present embodiment when the number of drain source lines DSL is changed within a range from 2 to 50 is described in comparison with a semiconductor device according to a comparative example.

Figure 5:
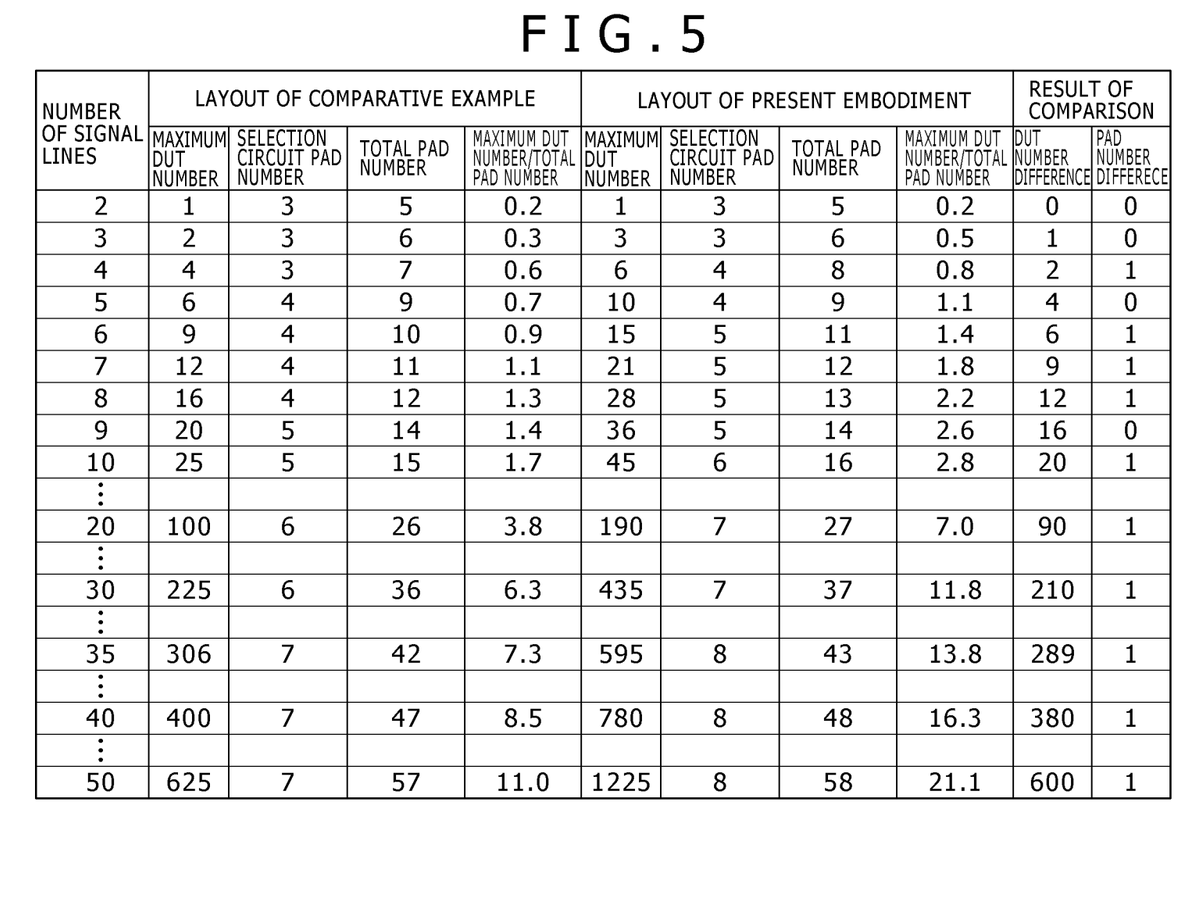
FIG. 5 depicts a comparison between a semiconductor device that is consistent with the present invention and another device.
Figure 13:
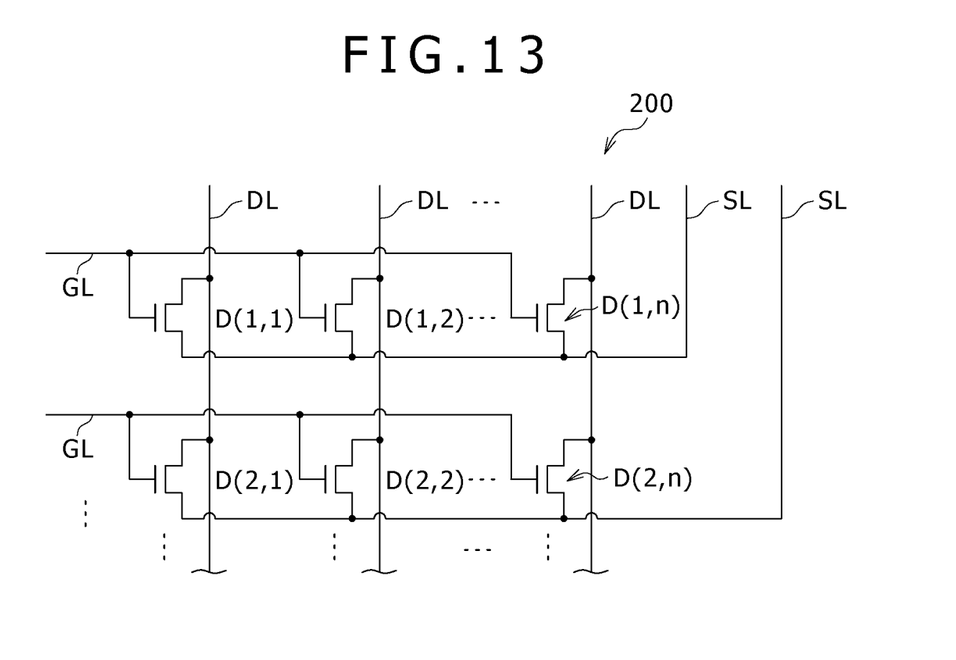
FIG. 13 is a circuit diagram of an existing semiconductor device.

FIG. 5 illustrates differences in layout between the semiconductor device 1 of the present embodiment and the semiconductor device according to the comparative example when the number of drain source lines DSL is changed within the range from 2 to 50. Here, the semiconductor device according to the comparative example is configured particularly including a test element group 200 of the X-Y address method shown in FIG. 13.

Referring to FIG. 5, "Maximum DUT number" represents a maximum value of the number of elements which can be incorporated in the test element group. "Selection circuit PAD number" represents a minimum value of the number of PADs required when a number of elements equal to the maximum DUT number are incorporated in the test element group and a selection circuit which can select the elements is configured. "Total PAD number" represents the sum of a total number of pads connected to the drain source lines and a total number of pads connected to the selection circuit. "Maximum DUT number/total PAD number" represents the number of elements per one pad. That "Maximum DUT number/total PAD number" is high signifies that a greater number of elements can be incorporated per one pad. "DUT number difference" represents a value obtained by subtracting the number of elements incorporated in the semiconductor device according to the comparative example from the number of elements incorporated in the semiconductor device 1 of the present embodiment. "PAD number difference" represents a value obtained by subtracting the number of pads incorporated in the semiconductor device according to the comparative example from the number of pads incorporated in the semiconductor device 1 of the present embodiment.

From "DUT number difference" of FIG. 5, it can be recognized that, where the number of drain source lines DSL is equal, the semiconductor device 1 of the present embodiment can incorporate a greater number of elements than the semiconductor device of the comparative example. Further, from "Maximum DUT number/total PAD number" of FIG. 5, it can be recognized that the semiconductor device 1 of the present embodiment can incorporate a greater number of elements per one pad than the semiconductor device of the comparative example.

Modification to the First Embodiment

Figure 6:
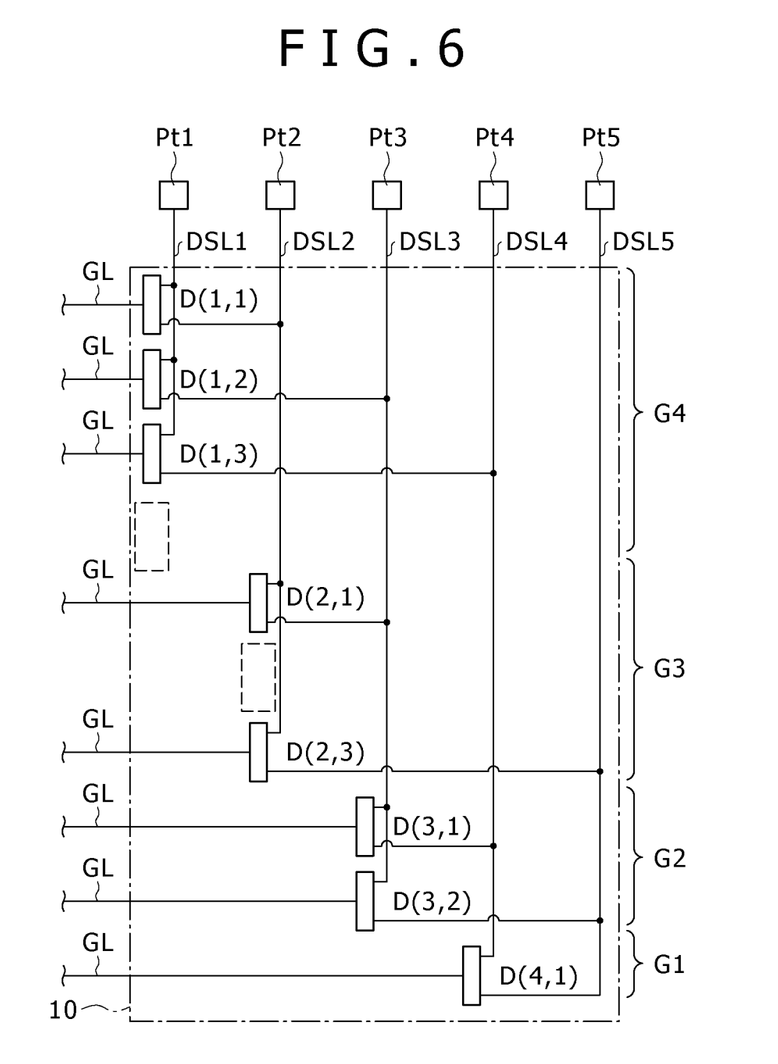
FIGS. 6 and 7 are circuit diagrams=of a test element group that is consistent with the present invention.

While, in the embodiment described hereinabove, the number of elements D allocated to the groups GN increases one by one as the group number which corresponds to the suffix N increases, it may not exhibit such variation. In one embodiment that is consistent with the present invention, one element D may be absent in the group G3 or one element D may be absent in the group G4 as seen in FIG. 6.

Figure 7:
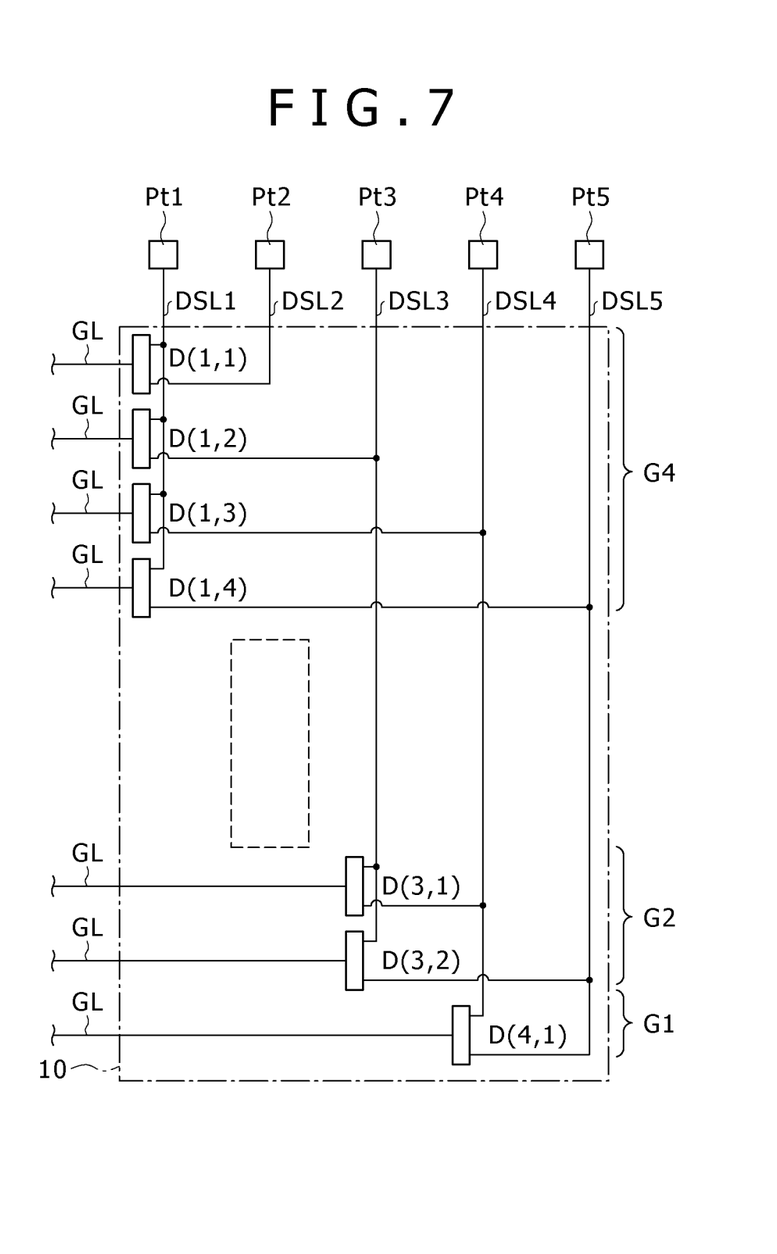

Further, while, in the embodiment described above, the number of group GN is n−1, it may otherwise be smaller than n−1. In one embodiment that is consistent with the present invention, one group such as the group G3 may be absent as seen in FIG. 7.

Second Embodiment

Figure 8:
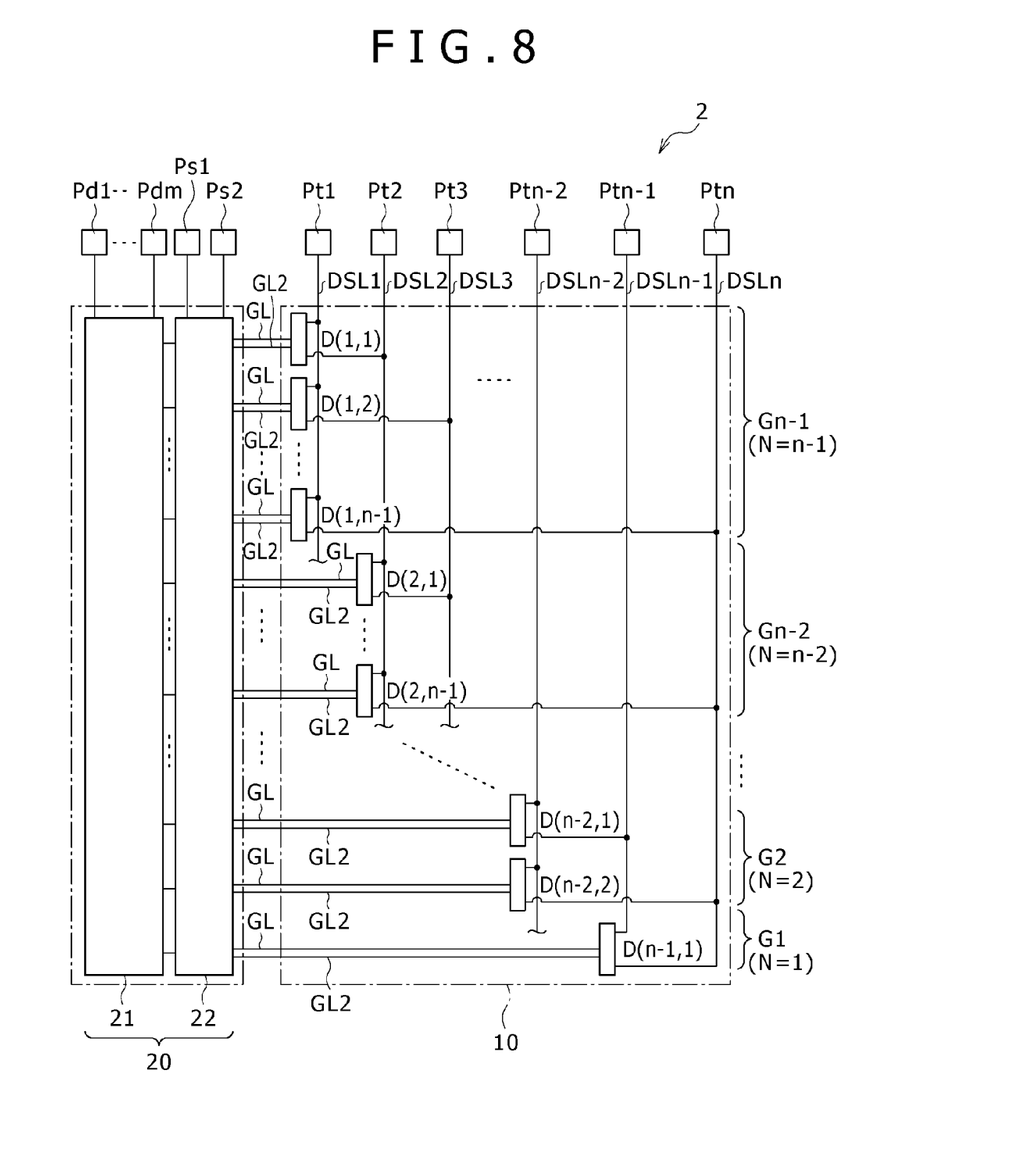
FIG. 8 is a circuit diagram of a semiconductor device that is consistent with the present invention.

FIG. 8 shows one embodiment of a general configuration of a semiconductor device 2 that is consistent with the present invention. Referring to FIG. 8, the semiconductor device 2 includes a test element group 10 and a selection circuit 20 provided on a semiconductor substrate not shown similarly to the semiconductor device 1 of the first embodiment described hereinabove. The semiconductor device 2 has a configuration different from that of the semiconductor device 1 of the first embodiment in that an element having four terminals is incorporated as an element D in the test element group 10. Therefore, the following description is given principally of the difference of the semiconductor device 2 of the present embodiment from the semiconductor device 1 of the first embodiment while overlapping description of common features to those of the semiconductor device 1 of the first embodiment is suitably omitted herein to avoid redundancy.

Figure 9:
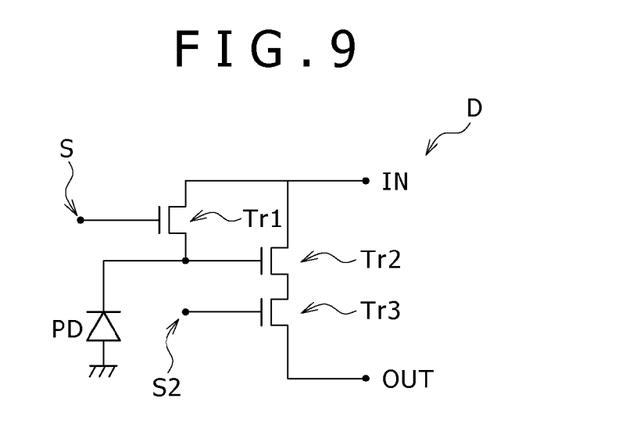
FIG. 9 is a circuit diagram of an evaluating cell incorporated in a test element group that is consistent with the present invention.

As described hereinabove, in the present embodiment, a four-terminal element is incorporated as an element D in the test element group 10. Such an element D as just described may be, a unit pixel cell of a CMOS (Complementary Metal Oxide Semiconductor) image sensor as shown in FIG. 9. In this instance, the element D has two selection terminals S and S2, one input terminal IN and one output terminal OUT.

Each unit pixel cell of the image sensor includes, as shown in FIG. 9, three transistors Tr1 to Tr3 and one photodiode PD. The transistor Tr1 is connected at the gate thereof to a selection terminal S, and the drain or the source of the transistor Tr1 and the drain or the source of the transistor Tr2 from between the two transistors Tr2 and Tr3 which are connected in series. Further, the transistor Tr3 is connected at the gate thereof to a second selection terminal S2 and is connected at the drain or the source thereof to the output terminal OUT.

In the present embodiment, the switch circuit 22 includes two gate lines GL and GL2 for one element D. The gate line GL is connected to the selection terminal S while the gate line GL2 is connected to the selection terminal S2. The decoder circuit 21 is allocated to each one switch circuit 22.

[Operation]

Now, an example of operation of the semiconductor device 2 of the present embodiment is described.

First, a gate selection signal is inputted from an evaluation circuit not shown, which is used to evaluate the semiconductor device 2, to the decoder circuit 21. Consequently, from the switch element 22A corresponding to the element D(1, 1), two selection gate voltages or on voltages are outputted separately from each other to the selection terminal S of the element D(1, 1). At this time, a signal for evaluation is inputted to pads Pt1 to Pt5 of the evaluation apparatus not shown. In particular, a positive bias voltage is applied to the pad Pt1 to which the input terminal IN of the element D(1, 1) to which the selection gate voltage is inputted is connected. Further, to the pad Pt2 to which the output terminal OUT of the element D(1, 1) to which the selection gate voltage is inputted, a bias voltage lower than the voltage at the pad Pt2 is applied. In one embodiment that is consistent with the present invention, 0 volt is applied to the pad Pt2. Further, 0 volt is applied to the pads Pt3 to Pt5 to which any of the input terminal IN and the output terminal OUT of the element D(1, 1) is not connected. It is to be noted that, at this time, the pads Pt3 to Pt5 may be in an electrically floating state.

Consequently, the element D(1, 1) to which the selection gate voltage is inputted is rendered active and, the transistors Tr2 and Tr3 are turned on. Consequently, current I1 flows from the pad Pt1 to the pad Pt2 through the element D(1, 1). At this time, current which flows through the other elements D(1, 1), D(1, 2), . . . , D(1, n−1), D(2, 1), . . . , D(2, n−2), . . . , D(n−2, 1), D(n−2, 2) and D(n−1, 1) which are not active is not added to the current I1 detected at the pad Pt2. Accordingly, the evaluation apparatus can measure an element characteristic of the element D(1, 1) of the measurement target accurately based on the current I1 detected at the pad Pt2.

Effect

Incidentally, in the semiconductor device 2 of the present embodiment, in each group GN, all input terminals IN are connected to a common drain source line DSL. Consequently, the number of drain source lines DSL of the test element group 10 can be suppressed to n which is much small than the number of the elements D, that is, $\Sigma[k=1, n-1]k$. As a result, also the number of pads Pt1 to Ptn connected to the drain source lines DSL can be suppressed to n, and therefore, the area of the semiconductor device 1 can be reduced much from that according to the X-Y address method.

Further, in the present embodiment, in each group GN, all output terminals OUT are connected independently of any other output terminal OUT to those drain source lines DSL which are not connected to the input terminals IN. Further, a drain source line DSL common to one group GN and another drain source line DSL which is common to any other group GN are different from each other. Consequently, while the drain source lines DSL are used commonly, the possibility that current flowing through an element D of the measurement target and off leak current flowing to the other elements D which are not the target object may be combined with each other can be eliminated.

From the foregoing, with the present embodiment, it is possible to incorporate a greater number of elements D in a smaller area and measure an element characteristic with a high degree of accuracy.

Figure 10:
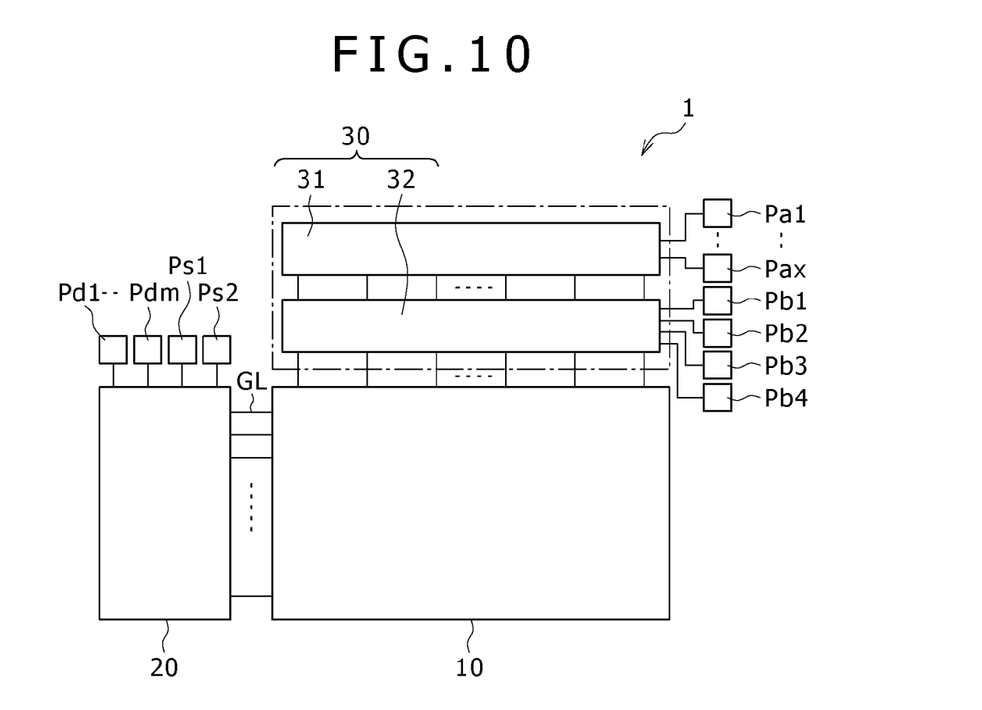
FIG. 10 is a circuit diagram of a semiconductor device that is consistent with the present invention.

In the first and second embodiments described above, a selection circuit may be provided for the drain source lines DSL. As shown in FIG. 10, a selection circuit 30 is provided for the drain source lines DSL. The selection circuit 30 includes, a decoder circuit 31 and a switch circuit 32.

Figure 11:
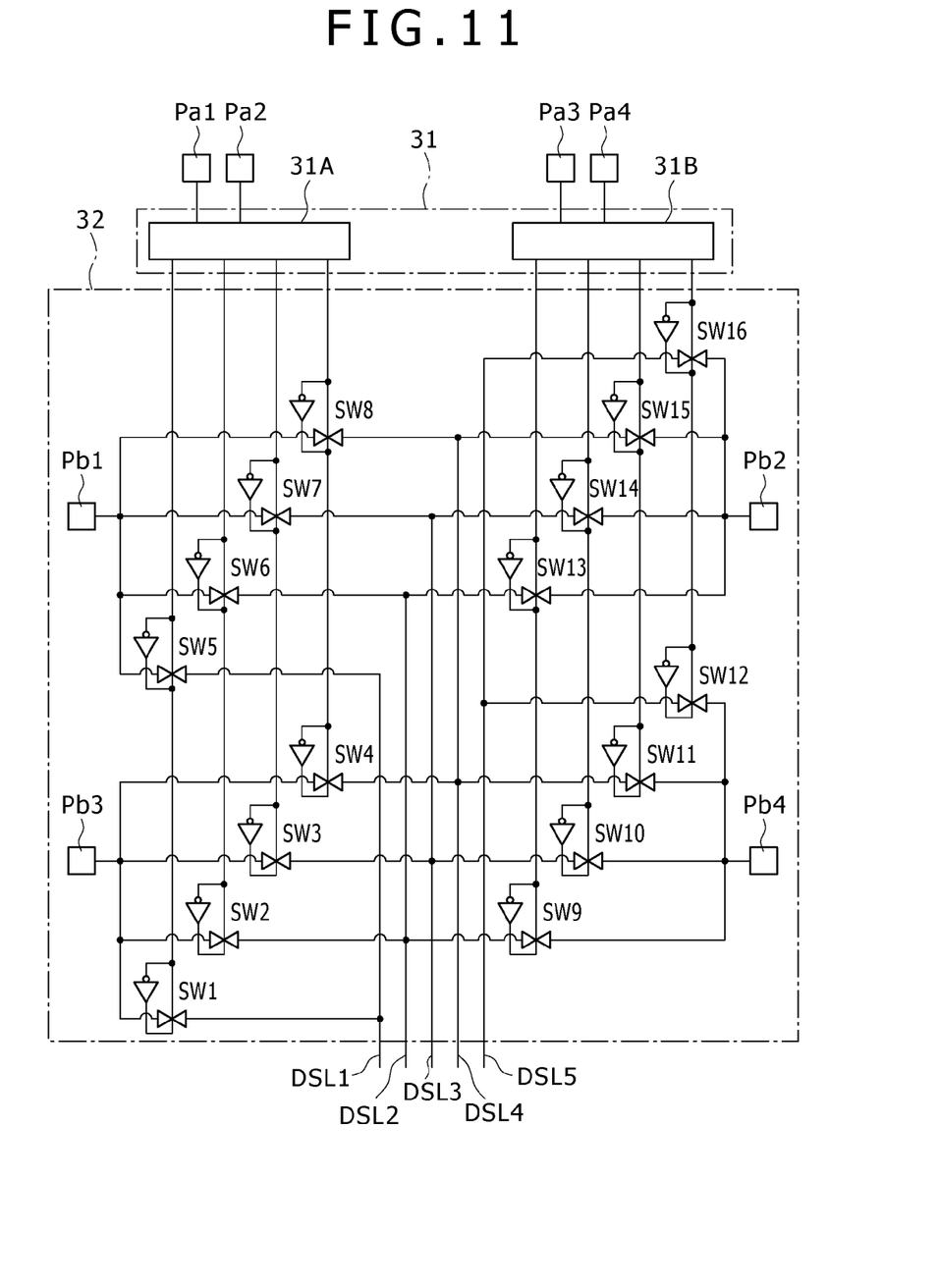
FIG. 11 is a circuit diagram of a selection circuit that is consistent with the present invention.

The switch circuit 32 has such a circuit configuration, as shown in FIG. 11 wherein 16 switch elements SW1 to SW16 are connected in Kelvin sense connection. The Kelvin sense connection is a connection method for carrying out I-V measurement of an element D without being influenced by a voltage drop by parasitic resistance of the 16 switch elements SW1 to SW16 and is configured such that each drain source line DSL is branched to a sense line and a force line. It is to be noted that, in FIG. 11, the switch elements SW1 to SW4 and SW9 to SW12 correspond to the sense lines while the switch elements SW5 to SW8 and SW13 to SW16 correspond to the force lines.

The decoder circuit 31 includes, as shown in FIG. 11, a decoder circuit 31A for controlling the switch elements SW1 to SW8 in the switch circuit 32 and a decoder circuit 31B for controlling the switch elements SW9 to SW16 in the switch circuit 32. It is to be noted that the decoder circuit 31 may otherwise be configured, from one decoder circuit which controls the switch elements SW1 to SW16 in the switch circuit 32.

In the present modification, the switch elements SW1 and SW5 are switched on and the switch elements SW2 to SW4 and SW6 to SW8 are switched off. Further, the switch elements SW9 and SW13 are switched on and the SW10 to SW12 and SW14 to SW16 are switched off. Consequently, a pad Pb1 connected to the switch element SW5 is connected to the drain source line DSL1, and a pad Pb3 connected to the switch element SW1 is connected to the drain source line DSL1. Further, a pad Pb2 connected to the switch element SW13 is connected to the drain source line DSL2, and a pad Pb4 connected to the switch element SW9 is connected to the drain source line DSL2. At this time, a positive bias voltage is applied to the pad Pb1, and a bias voltage lower than the voltage applied to the pad Pb1 such as, 0 volt is applied to the pad Pb2. At this time, if the element D(1, 1) is selected, then current flows from the pad Pb1 to the pad Pb2 through the element D(1, 1). At this time, a voltmeter is connected between the pad Pb3 connected to the switch element SW1 and the pad Pb4 connected to the switch element SW9 and the impedance is infinite, and therefore, no current flows through the switch elements SW1 and SW9 and no voltage drop is caused by the switch elements SW1 and SW9. Accordingly, also in this instance, an element characteristic can be measured with a high degree of accuracy.

It is to be noted that, where the voltage drop by the switch elements SW5 to SW8 and SW13 to SW16 can be ignored, the switch elements SW1 to SW4 and SW9 to SW12 may be omitted while the potential difference between the pad Pb1 and the pad Pb2 is measured to evaluate an element characteristic.

It should be understood by those skilled in the art that various modifications, combinations, sub-combinations and alterations may occur depending on design requirements and other factors insofar as they are within the scope of the appended claims or the equivalents thereof.

What is claimed is:

1. A device comprising:
a plurality of elements separated into groups, each element including an activation terminal, an input terminal and an output terminal;
first signal lines;
second signal lines; and
third signal lines,
wherein,
for each group, the input terminals of each element are commonly connected to one of the first signal lines,
for each group, the each activation terminal is independently connected to one of the third signal lines, and
for each group, each output terminal is independently connected to one of the second signal lines or one of the first signal lines to which the input terminal of elements of a different group are connected.

2. The device of claim 1 wherein the output terminals of elements in different groups are commonly connected to one of the second signal lines.

3. The device of claim 1 wherein the output terminal of at least one element in one group is independently connected to a first signal line to which the input terminals of elements of another group are connected.

4. The device of claim 1 including a selection circuit that includes a plurality of selection elements, each selection element electrically coupled to the activation terminal of a corresponding element via a respective third signal line.

5. The device of claim 4 wherein each selection element sends a selection signal to the activation terminal of the corresponding element when the element is selected by the selection circuit.

6. The device of claim 1 including
a selection circuit that selects one element from each group, each selected element not sharing a common second signal line,
wherein,
each selected element receives a current signal from the first signal line and outputs the current signal to the second signal line connected to the selected element.

7. The device of claim 6 wherein the current sent through the first signal line is not output from the output terminals of the non selected elements sharing the same first signal line.

8. The device of claim 6 wherein the selection circuit simultaneously selects one element from each group with the selected elements not sharing a second signal line in common.

9. The device of claim 1 wherein each element is a pixel cell.

10. A method of testing a plurality of elements of device arranged into groups with each element including an activation terminal, an input terminal and an output terminal, the device also including first signal lines, second signal lines and third signal lines, wherein, for each group, the input terminals of each element are commonly connected to one of the first signal lines, for each group, the each activation terminal is independently connected to one of the third signal lines, and for each group, each output terminal is independently connected to one of the second signal lines or one of the first signal lines to which the input terminal of elements of a different group are connected, the method comprising:
activating one of the plurality of elements by sending an activation signal to the activation terminal of the element;
sending an input signal to the input terminal of the activated element by the first signal line; and
measuring a characteristic of the activated element by evaluating an output signal output by the activated element.

11. The method of claim 10 wherein the output signal is sent on a second signal line connected to at least one element in another group.

12. The method of claim 10 wherein the output signal is sent on a first signal line connected to at least one element in another group.

13. The method of claim 10 wherein a selection circuit sends a respective-activation signal to each selected element.

14. The method of claim 13 wherein the selection circuit includes a plurality of selection elements, each selection element being electrically connected to a respective activation terminal of a corresponding element.

15. The method of claim 10 wherein:
each selected element does not share a first signal line in common, and
each input signal is a current signal sent to the input terminal of each selected element by its respective first signal line that is then output from the output terminal of each selected element.

16. The method of claim 10 wherein the output terminal of the selected element is not connected to a first signal line to which the input terminals of elements of another group are connected.

17. The method of claim 10 including the step of simultaneously activating one element in each group and sending the input signal to each selected element in each group, wherein the output terminals of the selected elements are not commonly connected to either a first or second signal line.

18. The method of claim 10 wherein each element is a pixel cell.

19. A device comprising:
a plurality of elements, each element including an activation terminal, an input terminal and an output terminal;
a first signal line; and
second signal lines,
wherein,
the input terminals of each element are commonly connected to the first signal line, and
the output terminal of each element is independently connected to a different one of the second signal lines.

20. A method of testing a plurality of elements of a device, each element including an activation terminal, an input terminal and an output terminal, the device also including a first signal line and a plurality of second signal lines, the input terminal of each element being commonly connected to the first signal line, and the output terminal of each element being independently connected to a different second signal line, the method comprising:
activating one of the plurality of elements by sending an activation signal to the activation terminal of the element;
sending an input signal to the input terminal of the activated element via the first signal line connected thereto; and
measuring a characteristic of the activated element by evaluating an output signal output by the activated element on the second signal line connected to the activated element.

* * * * *